(12) United States Patent
Kanai et al.

(10) Patent No.: US 6,664,630 B2
(45) Date of Patent: Dec. 16, 2003

(54) SEMICONDUCTOR DEVICE

(75) Inventors: Tomonori Kanai, Kashiwa (JP);
Kiyoharu Kishimoto, Yokohama (JP)

(73) Assignee: Hitachi Maxell, Ltd., Ibaraki (JP)

( * ) Notice: Subject to any disclaimer, the term of this patent is extended or adjusted under 35 U.S.C. 154(b) by 0 days.

(21) Appl. No.: 10/270,560

(22) Filed: Oct. 16, 2002

(65) Prior Publication Data

US 2003/0071284 A1 Apr. 17, 2003

(30) Foreign Application Priority Data

Oct. 16, 2001 (JP) ........................................ 2001-318171

(51) Int. Cl.$^7$ ................................................ H01L 23/34
(52) U.S. Cl. ........................ 257/728; 257/728; 257/691; 257/692
(58) Field of Search .................... 257/728, 737, 257/696, 692, 688, 701, 690, 691; 333/246

(56) References Cited

U.S. PATENT DOCUMENTS

| 5,679,977 A | | 10/1997 | Khandros et al. |
| 5,753,972 A | * | 5/1998 | Wein et al. ................. 257/691 |
| 5,801,441 A | | 9/1998 | DiStefano et al. |
| 5,936,492 A | * | 8/1999 | Shingyoji et al. .......... 333/246 |
| 6,057,600 A | * | 5/2000 | Kitazawa et al. ........... 257/728 |
| 2002/0003298 A1 | * | 1/2002 | Koriyama et al. .......... 257/728 |

FOREIGN PATENT DOCUMENTS

| JP | 04-019855 A | 1/1992 |
| JP | 06-237653 A | 8/1994 |

* cited by examiner

*Primary Examiner*—David Nelms
*Assistant Examiner*—Thinh Nguyen
(74) *Attorney, Agent, or Firm*—Birch, Stewart, Kolasch & Birch, LLP

(57) ABSTRACT

In a semiconductor device for treating signals of frequency not less than 800 MHz, a minimum thickness of an electrically conductive wire connecting a semiconductor electric circuit in the semiconductor device to an electric member other than the semiconductor device is determined along the following formula:

$$2*\sqrt{\frac{2}{\omega\mu\kappa}} < h$$

when h is the minimum thickness of the electrically conductive wire, κ is an electrical conductivity of the electrically conductive wire, μ is a magnetic permeability of the electrically conductive wire, ω is an angular frequency of the signals transmitted through the electrically conductive wire.

10 Claims, 4 Drawing Sheets

FIG.6

| | CONDUCTIVITY [Ω·cm] | FREQUENCY [MHz] | | | | | |
|---|---|---|---|---|---|---|---|
| | | 900 | 1500 | 1900 | 2100 | 2400 | 5200 |
| Cu PLATING LAYER | $1.90e^{-6}$ | 4.62 | 3.58 | 3.18 | 3.02 | 2.83 | 1.92 |
| Cu BULK LAYER | $1.72e^{-6}$ | 4.40 | 3.41 | 3.03 | 2.88 | 2.69 | 1.83 |
| Al | $2.65e^{-6}$ | 5.45 | 4.23 | 3.75 | 3.57 | 3.34 | 2.27 |

MINIMUM THICKNESS μm

SEMICONDUCTOR DEVICE

BACKGROUND OF THE INVENTION AND RELATED ART STATEMENT

The present invention relates to a semiconductor device, particularly a chip-size package (CSP) type semiconductor device for treating signals of high frequency.

JP-A-4-19855, JP-A-6-237653, U.S. Pat. Nos. 5,679,977 and U.S. Pat. No. 5,801,441 disclose a wafer level chip-size package (CSP) type semiconductor device having a semiconductor element including a semiconductor electric circuit and electrically conductive terminal surface areas (first bonding pads) electrically connected to the semiconductor electric circuit, a first electrically insulating layer covering the semiconductor element while being prevented from covering at least a part of each of the first bonding pads, electrically conductive wires extending on the first electrically insulating layer, electrically connected at an end of each of the wires to the part of each of the first bonding pads so that the signals are input to the semiconductor electric circuit through the electrically conductive wires and/or output from the semiconductor electric circuit through the electrically conductive wires, and having an interface area (second bonding pad on which a bump electrode is formed) at another end of each of the wires, and a second electrically insulating layer covering the electrically conductive wires and the first electrically insulating layer while being prevented from covering at least a part of the another end of each of the wires.

OBJECT AND SUMMARY OF THE INVENTION

An object of the present invention is to provide a chip-size package (CSP) type semiconductor device for treating signals of high frequency, in which device an excessive temperature increase is restrained and a thermal stress is decreased.

According to the present invention, a semiconductor device for treating signals of frequency not less than 800 MHz, comprises, a semiconductor element including a semiconductor electric circuit and an electrically conductive terminal surface area electrically connected to the semiconductor electric circuit, a first electrically insulating layer covering the semiconductor element while being prevented from covering at least a part of the electrically conductive terminal surface area, an electrically conductive wire extending on the first electrically insulating layer, electrically connected at an end of the wire to the part of the electrically conductive terminal surface area so that the signals are input to the semiconductor electric circuit through the electrically conductive wire and/or output from the semiconductor electric circuit through the electrically conductive wire, and having an interface area at another end of the wire, and a second electrically insulating layer covering the electrically conductive wire and the first electrically insulating layer while being prevented from covering at least a part of the interface area, wherein a minimum thickness of the electrically conductive wire is determined along the following formula:

$$2*\sqrt{\frac{2}{\omega\mu\kappa}} < h$$

when h is the minimum thickness of the electrically conductive wire, κ is an electrical conductivity of the electrically conductive wire, μ is a magnetic permeability of the electrically conductive wire, ω is an angular frequency of the signals transmitted through the electrically conductive wire.

Since the minimum thickness of the electrically conductive wire is determined along the following formula:

$$2*\sqrt{\frac{2}{\omega\mu\kappa}} < h$$

the minimum thickness of the electrically conductive wire includes two times the skin depth caused by the skin effect established in the electrically conductive wire by the frequency of the signals and a central thickness other than the two times the skin depth so that a thermal energy or an electrically energy loss generated by an electric current through the skin depth is transmitted through the central thickness in which a flow of the electric current is restrained relatively in comparison with the skin depth. Therefore, an efficiency of thermal conductivity through the electrically conductive wire is kept high by the central thickness so that in the semiconductor device, an excessive temperature increase and/or a thermal stress is restrained.

If the entire length of the electrically conductive wire between the ends thereof is prevented from having thickness and/or width less than the minimum thickness, the efficiency of thermal conductivity through the electrically conductive wire is kept high over the entire length of the electrically conductive wire between the ends thereof so that the thermal conductivity is not throttled at any position over the entire length of the electrically conductive wire between the ends thereof.

It is preferable for keeping the total thickness of the electrically conductive wire small that the central thickness is not more than two times the skin depth or the skin depth. When the thermal conductivity needs to be kept high while keeping the total thickness of the electrically conductive wire small, the central thickness is not less than the skin depth and not more than two times the skin depth. For example, the central thickness is not more than 5 μm, and/or the minimum thickness is not less than 4 μm when the frequency of the signals is between 900 MHz and 1900 MHz.

BRIEF DESCRIPTION OF THE DRAWINGS

FIG. 6 is a table showing a relationship among a material of the electrically conductive wire, a conductivity of the electrically conductive wire, a frequency of signals transmitted through the electrically conductive wire, and a minimum thickness of the electrically conductive wire.

DETAILED DESCRIPTION OF PREFERRED EMBODIMENTS

Figure 1:
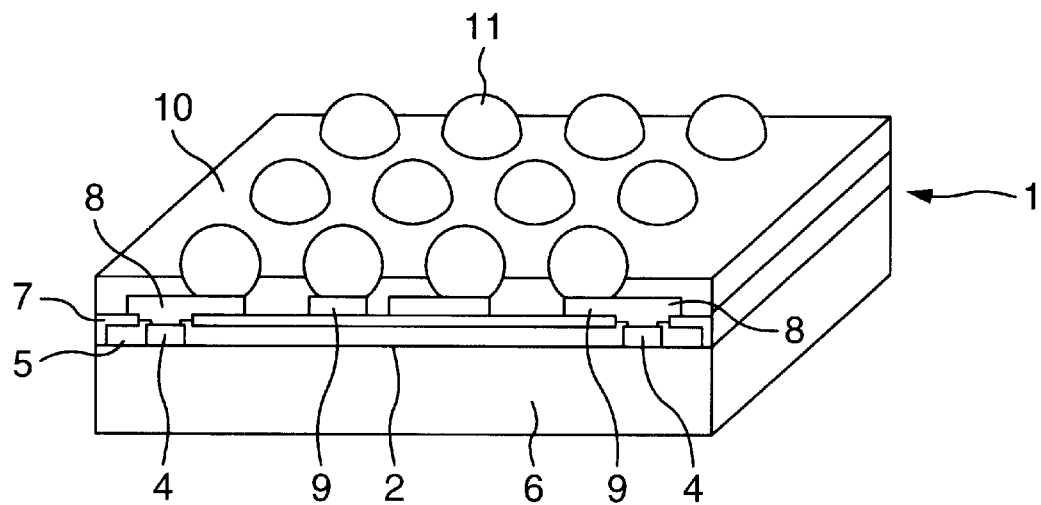
FIG. 1 is a schematic oblique projection view showing a chip-size package (CSP) type semiconductor device according to the invention.
Figure 2:
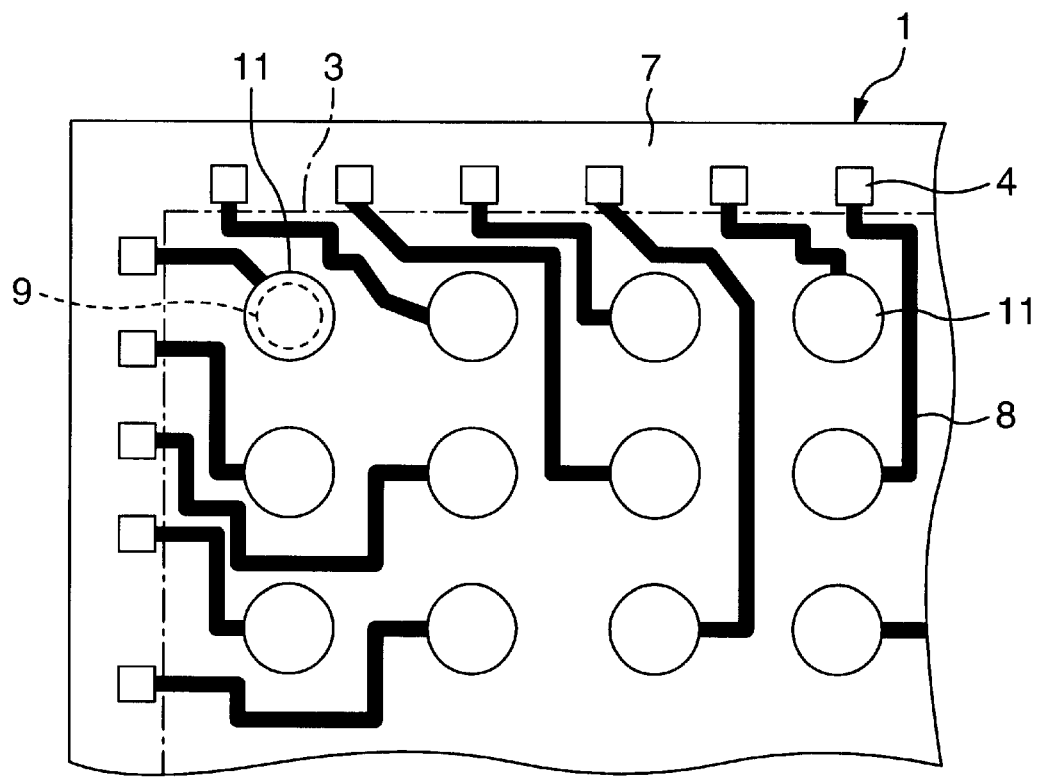
FIG. 2 is a schematic plan view showing electrically conductive wires respectively connecting electrically conductive terminal surface areas of a semiconductor element to interface areas to be electrically connected to an electric member other than the chip-size package (CSP) type semiconductor.
Figure 3:
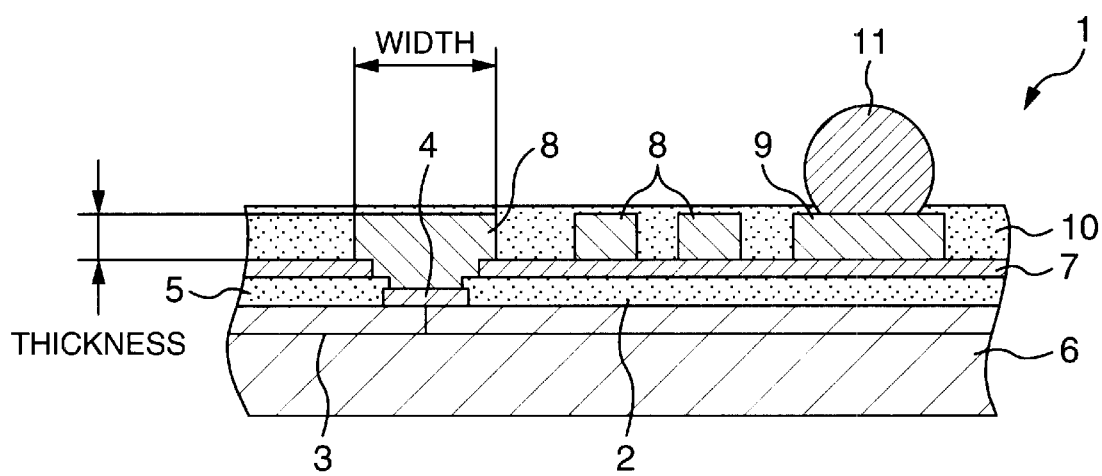
FIG. 3 is a schematic cross sectional view of the chip-size package type semiconductor device.
Figure 4:
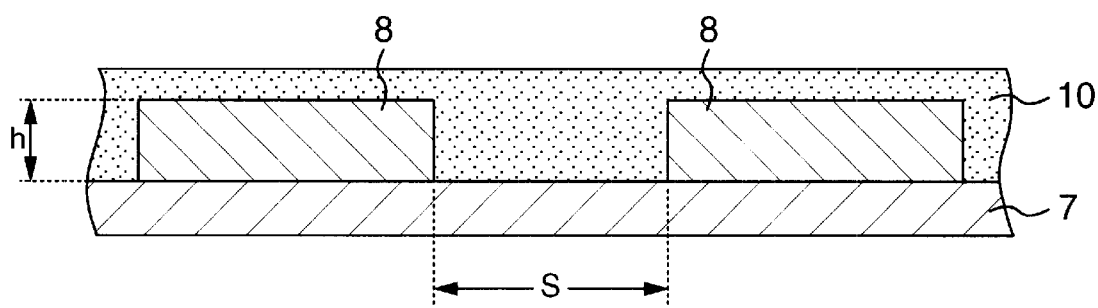
FIG. 4 is an enlarged schematic cross sectional view showing the electrically conductive wires.
Figure 5:
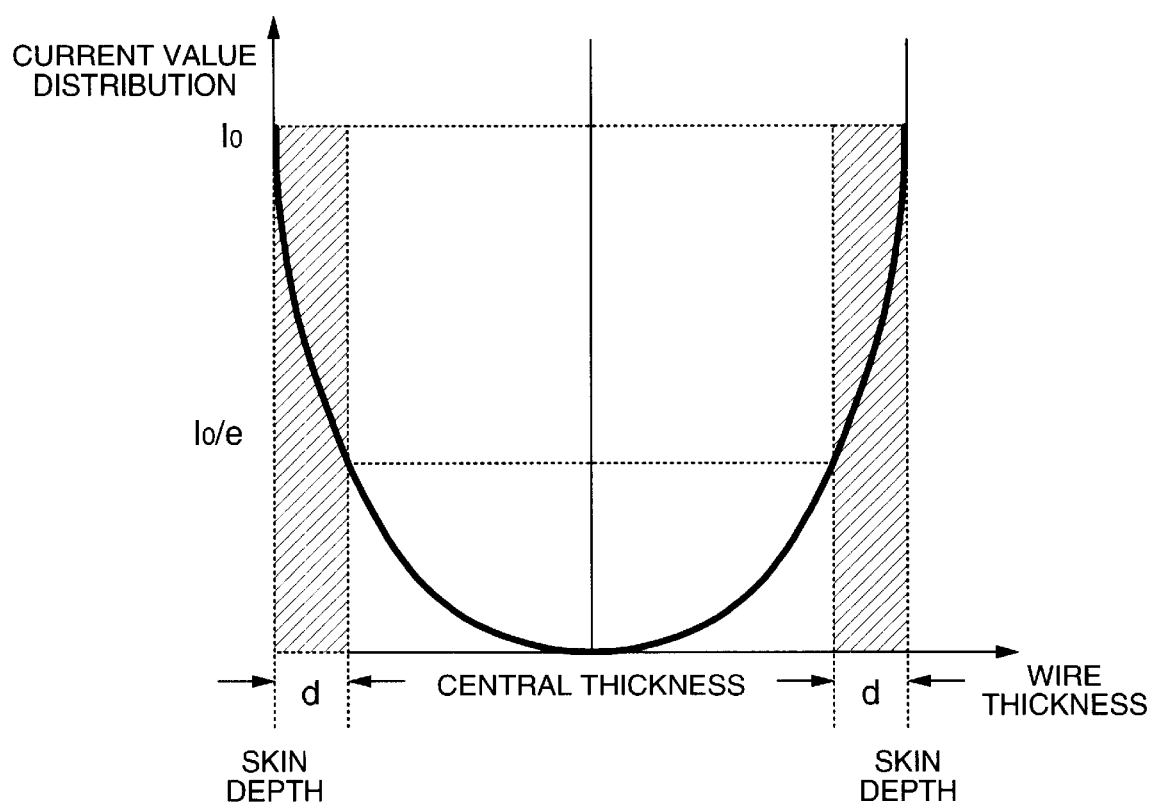
FIG. 5 is a diagram showing a relationship between an electric current value distribution and a thickness direction position in the electrically conductive wire.

As shown in FIGS. 1–3, a wafer level chip-size package (CSP) type semiconductor device 1 has a semiconductor element 6 including a semiconductor electric circuit 3 and on a main surface 2 of the semiconductor element 6, first bonding pads 4 as electrically conductive terminal surface areas electrically connected to the semiconductor electric circuit 3, a first electrically insulating layer 7 covering the main surface 2 of the semiconductor element 6 with a passivating layer 5 between the first electrically insulating layer 5 and the main surface 2 while being prevented from covering at least a part of each of the first bonding pads 4, electrically conductive wires 8 extending on the first electrically insulating layer 7, electrically connected at an end of each of the wires 8 to the part of each of the first bonding pads 4 so that the signals are input to the semiconductor electric circuit 3 through the electrically conductive wires 8 and/or output from the semiconductor electric circuit 3 through the electrically conductive wires 8, and having an interface area 9 at another end of each of the wires 8, and a second electrically insulating layer 10 covering the electrically conductive wires 8 and the first electrically insulating layer 7 while being prevented from covering at least a part of each of the interface areas 9 on which bump electrodes 11 are formed respectively.

The first bonding pads 4 are formed of aluminum or aluminum alloy, the electrically conductive wires 8 are formed of Copper or copper alloy, the first and second electrically insulating layers 7 and 10 are formed of polyimide resin, and the bump electrodes 11 are formed of lead-free solder.

A minimum thickness of the electrically conductive wire 8 is determined along the following formula:

$$2*\sqrt{\frac{2}{\omega\mu\kappa}} < h$$

when h is the minimum thickness of the electrically conductive wire 8, κ is an electrical conductivity of the electrically conductive wire 8, $\mu$ is a magnetic permeability of the electrically conductive wire 8, ω is an angular frequency of the signals transmitted through the electrically conductive wire 8. That is, the minimum thickness of the electrically conductive wire 8 is more than two times the so-called skin depth caused by the so called skin-effect established in the electrically conductive wire 8 by the high frequency of the signals not less than 800 MHz.

As shown in FIG. 6, the minimum thickness of the electrically conductive wire 8 changes in accordance with the frequency of the signals transmitted through the electrically conductive wire 8. A maximum thickness of the electrically conductive wire 8 is preferably not more than 10 μm.

What is claimed is:

1. A semiconductor device for treating signals of frequency not less than 800 MHz, comprising,
    a semiconductor element including a semiconductor electric circuit and an electrically conductive terminal surface area electrically connected to the semiconductor electric circuit,
    a first electrically insulating layer covering the semiconductor element while being prevented from covering a part of the electrically conductive terminal surface area,
    an electrically conductive wire extending on the first electrically insulating layer, electrically connected at an end of the wire to the part of the electrically conductive terminal surface area so that the signals are input to the semiconductor electric circuit through the electrically conductive wire and/or output from the semiconductor electric circuit through the electrically conductive wire, and having an interface area at another end of the wire, and
    a second electrically insulating layer covering the electrically conductive wire and the first electrically insulating layer while being prevented from covering a part of the interface area,
    wherein a minimum thickness of the electrically conductive wire is determined along the following formula:

$$2*\sqrt{\frac{2}{\omega\mu\kappa}} < h$$

when h is the minimum thickness of the electrically conductive wire, κ is an electrical conductivity of the electrically conductive wire, $\mu$ is a magnetic permeability of the electrically conductive wire, ω is an angular frequency of the signals transmitted through the electrically conductive wire.

2. A semiconductor device according to claim 1, wherein the entire length of the electrically conductive wire between the ends thereof is prevented from having thickness less than the minimum thickness.

3. A semiconductor device according to claim 1, wherein the entire length of the electrically conductive wire between the ends thereof is prevented from having a width less than the minimum thickness.

4. A semiconductor device according to claim 1, wherein the minimum thickness is not less than 4 μm when the frequency of the signals is between 900 MHz and 1900 MHz.

5. A semiconductor device according to claim 1, wherein the minimum thickness of the electrically conductive wire includes two times the skin depth caused by the skin effect established in the electrically conductive wire by the frequency of the signals and a central thickness other than the two times the skin depth so that a thermal energy generated by an electric current through the skin depth is transmitted through the central thickness in which a flow of the electric current is restrained relatively in comparison with the skin depth.

6. A semiconductor device according to claim 5, wherein the central thickness is not more than the skin depth.

7. A semiconductor device according to claim 6, wherein the central thickness is not more than two times the skin depth.

8. A semiconductor device according to claim 6, wherein the central thickness is not more than 5 μm.

9. A semiconductor device according to claim 6, wherein the central thickness is not less than the skin depth and not more than two times the skin depth.

10. A semiconductor device according to claim 6, wherein the central thickness is not more than the skin depth.

* * * * *